United States Patent [19]
Fransson

[11] Patent Number: 5,940,467
[45] Date of Patent: Aug. 17, 1999

[54] COUNTING CIRCUIT

[75] Inventor: Clarence Jörn Niklas Fransson, Älvsjö, Sweden

[73] Assignee: Telefonaktiebolaget LM Ericsson, Stockholm, Sweden

[21] Appl. No.: 09/132,336

[22] Filed: Aug. 12, 1998

Related U.S. Application Data

[63] Continuation of application No. PCT/SE97/00216, Feb. 12, 1997.

[30]     Foreign Application Priority Data

Feb. 14, 1996 [SE] Sweden ................................ 9600541

[51] Int. Cl.$^6$ .................................................. H03K 21/00
[52] U.S. Cl. ............................. 377/49; 377/47; 377/50; 379/237; 379/299
[58] Field of Search ................................ 379/237, 299; 377/47, 49, 50

[56]         References Cited

U.S. PATENT DOCUMENTS

| | | | |
|---|---|---|---|
| 4,912,734 | 3/1990 | Frauenglass | 377/20 |
| 4,979,177 | 12/1990 | Jackson | 377/20 |
| 5,097,490 | 3/1992 | Hulsing, II et al. | 377/28 |
| 5,422,923 | 6/1995 | Fucili et al. | 377/49 |
| 5,469,483 | 11/1995 | Inoue et al. | 377/49 |

*Primary Examiner*—Margaret R. Wambach
*Attorney, Agent, or Firm*—Burns, Doane, Swecker & Mathis, L.L.P.

[57]         ABSTRACT

Quality requirements on a counter may set a limit to the highest frequency that can be applied to the counter. This will also limit the resolution. A counter is provided including a generator for generating, in response to a first clock frequency, M second clock signals phase shifted with respect to each other and of a second frequency lower than the first frequency, and M secondary counters, each one responsive to a respective one of the M second clock signals for generating a secondary counter signal. The second frequency is adapted to work well in the technology available for realizing the secondary counters, with consideration taken to quality requirements. Furthermore, the counter included a summing circuit responsive to the secondary counter signals for generating the resulting counter signals by adding the secondary counter signals such that the counter signal has the same number of bits and the same significance as the secondary counter signals.

12 Claims, 8 Drawing Sheets

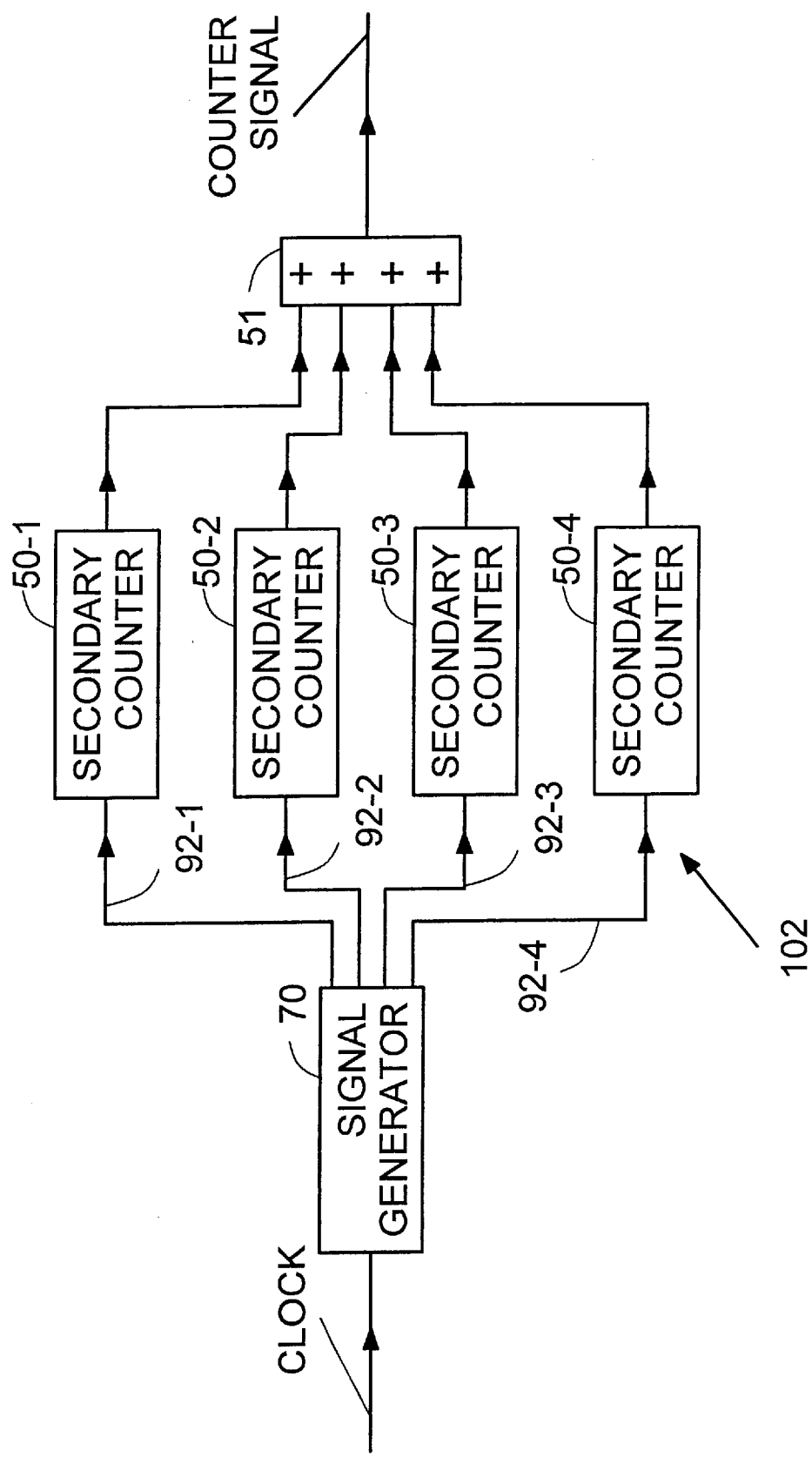

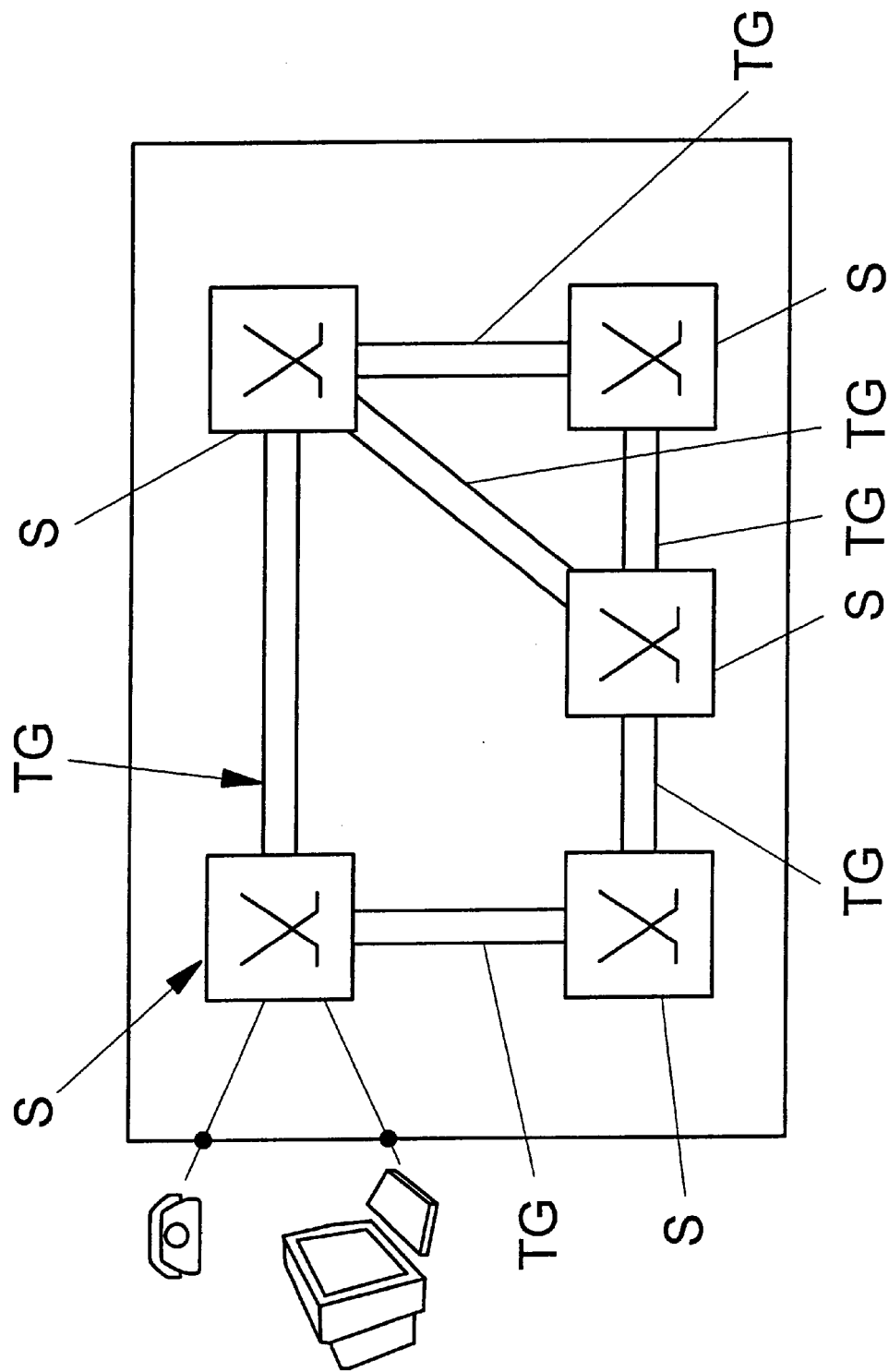

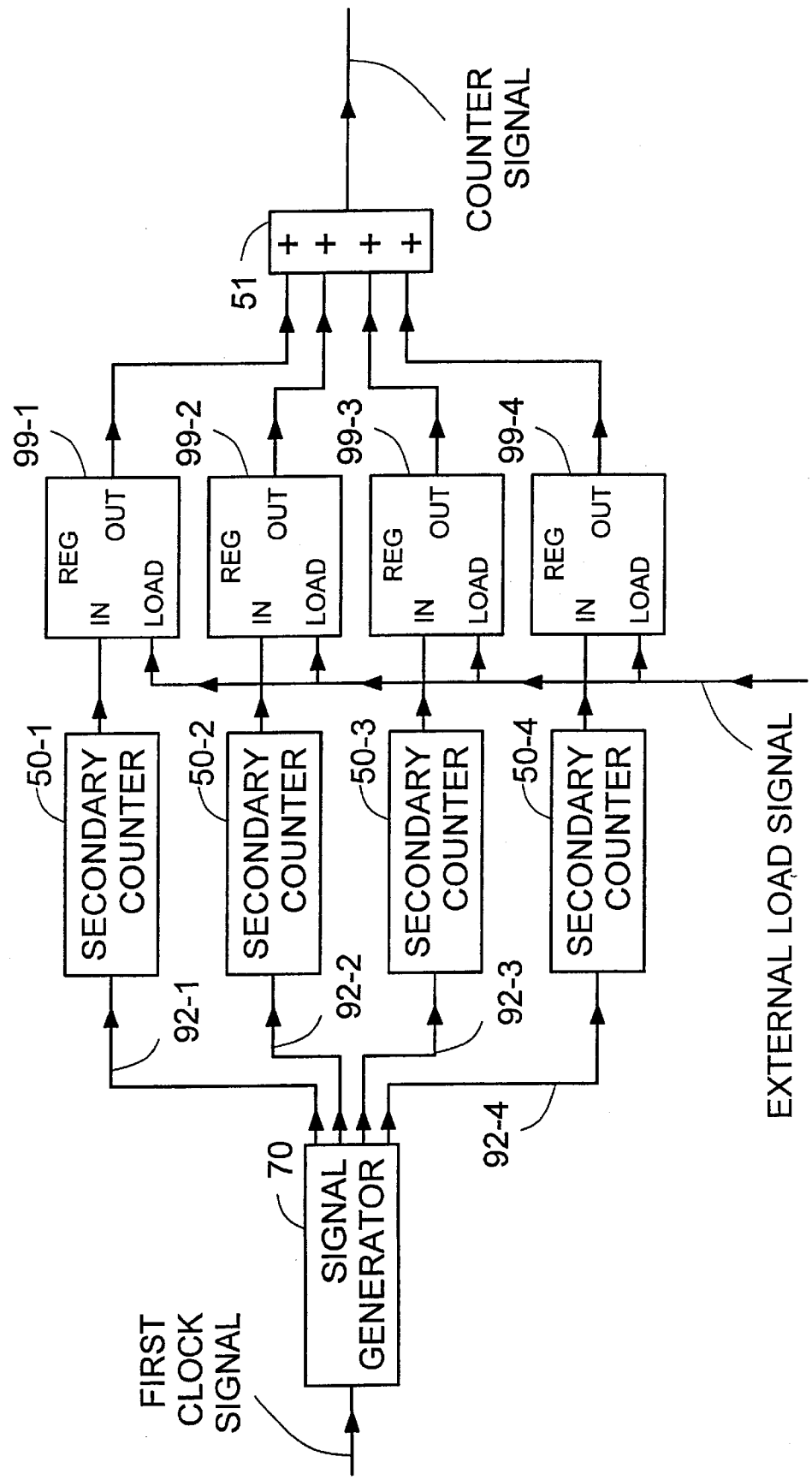

COUNTING CIRCUIT

This application is a continuation of International Application No. PCT/SE97/00216 filed on Feb. 12, 1997, which designates the United States.

TECHNICAL FIELD OF THE INVENTION

The present invention generally relates to a counting circuit and a method for generating a counter signal.

BACKGROUND

Counting circuits or counters are found in numerous applications of all modern technologies. They are widely used in areas of electronics and in different fields of communication, in particular the field of telecommunication.

In particular, regarding phase difference measurements as well as frequency measurements, counters are often used as part of an overall circuit.

Basically, a counter is an arrangement for counting the number of incoming pulses of a clock signal. A counter is generally a sequential circuit which registers incoming pulses by entering, for each pulse, a new state that represents the number of pulses. The output data of the counter are the state variables.

The unit in a counter that actually registers the incoming pulses of a clock signal is referred to as the counter core. Any technology available for realizing the core of a counter sets a limit to the highest frequency that can be applied to the counter core. Besides, additional requirements on the circuit design within the chosen technology may lower this frequency limit.

The resolution accuracy of a counter is generally determined by the frequency of the clock signal that is applied thereto. A high frequency will yield a high resolution. When a counter is implemented in a given technology the frequency of the clock signal that is applied to the counter may be too high for reliable and/or optimal operation of the counter. Thus, a lower frequency has to be used, naturally leading to a lower resolution accuracy. Utilizing very high frequency technologies for realizing the counter core generally imply high effective costs for the circuit design.

FIG. 1 is a block diagram of a frequency counter in accordance with U.S. Pat. No. 5,097,490. The frequency of an input signal is counted in respect to the number of clock pulses that occur between either successive rising or falling edges of the input signal. A reference clock 31 supplies a gating circuit 30 and counter A, 34, with clock signals. The gating circuit 30 receives an input signal. Counter A, 34, receives, from the gating circuit 30, a signal that controls the period of time during which the counter A, 34, counts clock pulses. The clock signal from clock 31 is applied to an inverter 32, which provides an inverted clock signal. The inverted clock signal is supplied to another gating circuit 33 and to counter B, 35. The gating circuit 33 receives the same input signal as the gating circuit 30. Counter B, 35, receives a signal from the gating circuit 33 such that the gating circuit 33 controls the accumulation of inverted clock cycles by counter B, 35. The output signal of counter A, 34, is added to the output signal of counter B, 35, in a summing circuit 36. The total count is divided by two in a divide-by-two circuit 37.

U.S. Pat. No. 4,979,177 relates to a logic analyzer which has a counter that can reconstruct the higher resolution with which data was acquired using two phases of the logic analyzer system clock signal.

In U.S. Pat. No. 4,912,734 there is disclosed a high resolution event occurrence time counter operating in two clock domains, the domain of clock signal A and the domain of clock signal B. The two clock signals are generated from a common clock signal. Clock signal A is provided to a free running counter, preferably including a Johnson counter and a binary counter. The count data of the free running counter is stored in a counter register in response to clock signal B, and is stored in a second register as second time of arrival data upon the generation of a second signal, B SYNC. B SYNC, when generated, will clear a first register. The data of the counter register is stored in the first register as first time of arrival data upon the generation of a first signal, A SYNC. A SYNC, when generated, will clear the second register. The event occurrence time counter also includes a clock edge encoder which is responsive to an input signal and the clock signals A and B for generating the A SYNC and B SYNC signals. If the input signal arrives during the first half cycle of the common clock signal, then A SYNC is generated. If the input signal arrives during the second half cycle of the common clock signal, then B SYNC is generated. In this way the clock edge encoder controls which of first and second time of arrival data is to be provided as the output data of the circuit.

The problem of having a clock frequency that is too high for available or utilized technology, taking specific quality requirements into account, is not encountered in any of the above U.S. patents.

SUMMARY

The present invention overcomes this and other problems of the conventional counter arrangements.

There is a general need for a counter, in the following referred to as a counting circuit, and, in particular a high resolution counting circuit.

It is a first object of the present invention to provide, given certain quality requirements on the circuit design of the counter core, a counting circuit of a resolution equal to half the cycle time of the first clock signal that is applied to the counting circuit, although the first clock frequency itself is too high for the technology available or utilized for realizing the counter core.

It is a second object of the invention to provide a corresponding method for generating a counter signal.

It is another object of the invention to provide a counting circuit, the resolution of which is equal to the cycle time of the first clock signal applied to the counting circuit, although the frequency of the first clock signal is too high for reliable operation of the counter core, taking frequency limiting design requirements on the core into account.

Yet another object of the invention is to provide a high resolution counting circuit, the components of which do not require initialization or reset.

In accordance with a first embodiment of the invention, the counting circuit comprises means for generating, in response to a first clock signal of a first frequency, a predetermined number, M, of second clock signals phase shifted with respect to each other and of a second frequency lower than the first frequency. The second frequency is adapted to work well in the technology that is available for realizing the counter core, with consideration taken to specific quality requirements on the circuit design of the core. Furthermore, the counting circuit comprises M secondary counters, each one responsive to a respective one of the M second clock signals for generating an individual secondary counter signal, and a summing circuit responsive to the secondary counter signals for generating the counter signal of the counting circuit by adding the secondary counter signals such that the counter value of the counter signal has the same number of bits and the same significance as the counter value of the secondary counter signals. The core of the counting circuit comprises the secondary counters.

The second clock signals are phase shifted with respect to each other such that the resulting counter value is updated with a frequency equal to M multiplied with the second frequency. In addition, since the resulting counter signal has the same number of bits and the same significance as the secondary counter signals, no initialization of the secondary counters is required.

The counting circuit according to the invention affords the following advantages:

No initialization of the hardware is required;

A resolution equal to half the cycle time of the input clock signal is obtained.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

FIG. 2 is a schematic block diagram of a counter or counting circuit according to a first embodiment of the invention;

FIG. 7 is a schematic block diagram of a telecommunication system; and

FIG. 8 is a schematic block diagram of a counting circuit according to another embodiment of the invention.

DETAILED DESCRIPTION

Figure 1:
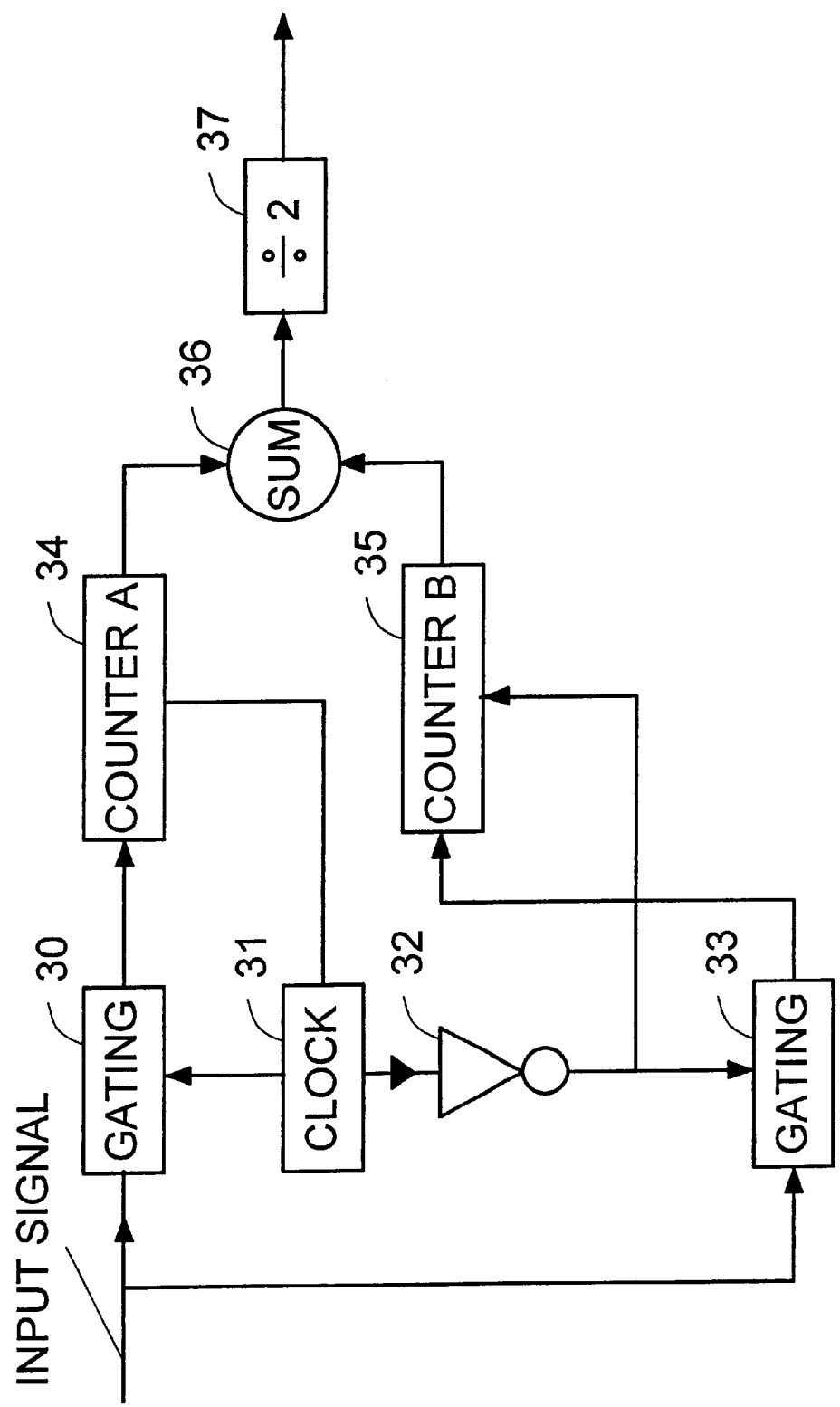
FIG. 1 is a schematic block diagram of a prior art frequency counter.

Assume, by way of example, that a counting circuit is to be designed in a given technology and that there are certain quality requirements on the circuit design of the counter core which set a limit to the highest frequency that can be reliably counted by the counter core. In addition, there are requirements on the resolution accuracy. Preferably, a high resolution is desired.

Assume, by way of example, that the counter core is to be implemented in a first predetermined technology, such as ASIC, and that there are quality requirements on the counter core such that the highest frequency that can be applied thereto is equal to a second frequency. For instance, if it is desirable to realize the counter core by scan testable flip-flops, then this requirement will set a limit to the highest clock frequency that is possible to use within the core.

First embodiment of the invention

FIG. 2 is a schematic block diagram of a counting circuit 102 according to a first embodiment of the invention. The counting circuit 102 is preferably implemented in an ASIC or equivalent, and comprises a generator 70 for generating four second clock signals, four secondary counters 50-1, 50-2, 50-3, 50-4 and a summing circuit 51. The generator 70 generates, in response to a first clock signal of a first frequency, four second clock signals phase shifted with respect to each other and of a second frequency that is lower than the first frequency. The first clock signal is generated by any conventional clock signal generator whatsoever known to the art. Each one of the four secondary counters 50-1, 50-2, 50-3, 50-4 is responsive to a respective one of the four second clock signals for generating an individual secondary counter signal. The core of the counting circuit comprises the secondary counters 50-1, 50-2, 50-3, 50-4. Preferably, the secondary counters are binary n-bits counters, implemented by scan testable flip-flops that are positive edge triggered. In this particular example, the use of scan testable flip-flops is an additional quality requirement within the chosen technology (ASIC). Assume that the first frequency is too high for scan testable flip-flops. The generator 70 is thus designed such as to generate the second clock signals with a second frequency that works well in the counter core. In this particular example, the second frequency is equal to the first frequency divided by two. The summing block or summing circuit 51 receives the secondary counter signals for generating the output counter signal of the counting circuit 102 by adding the secondary counter signals such that the counter value of the output counter signal has the same number of bits and the same significance as the counter value of the secondary counter signals.

The specific counting circuit of FIG. 2 is only given as an example. The number of second clock signals and the number of secondary counters may differ, as will be exemplified later.

A counter signal is generally defined as the output data of a counter. A counter value is defined to be the same as a count value.

Figure 3A:
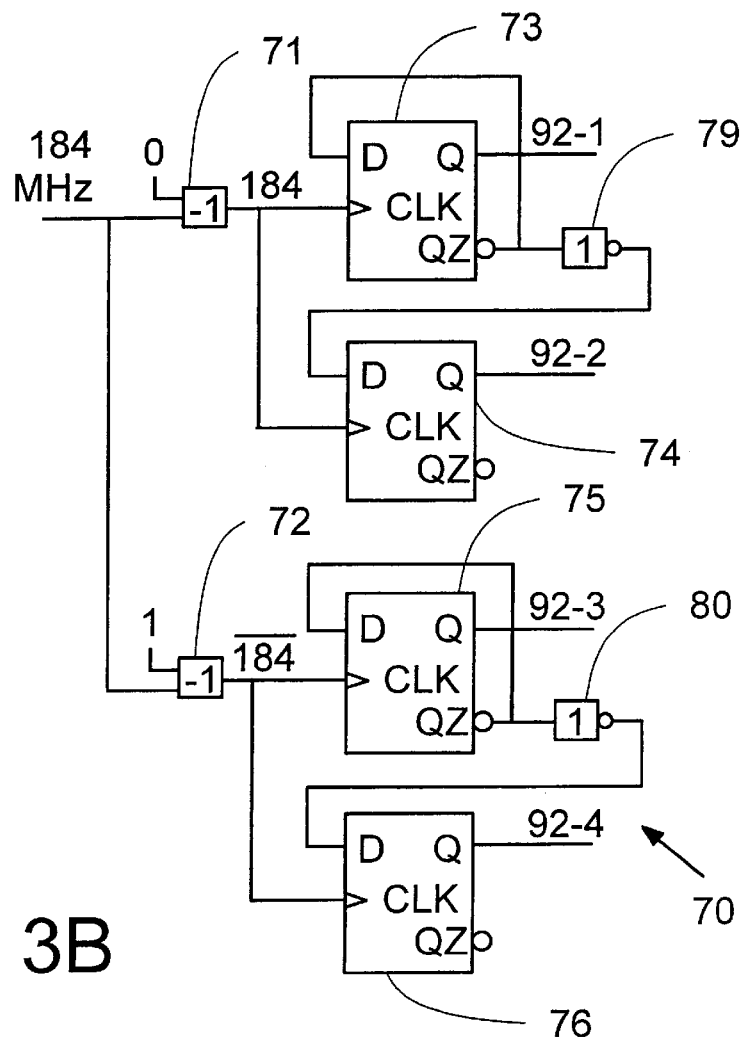
FIG. 3 is a schematic block diagram of a first generator of second clock signals.
Figure 3B:
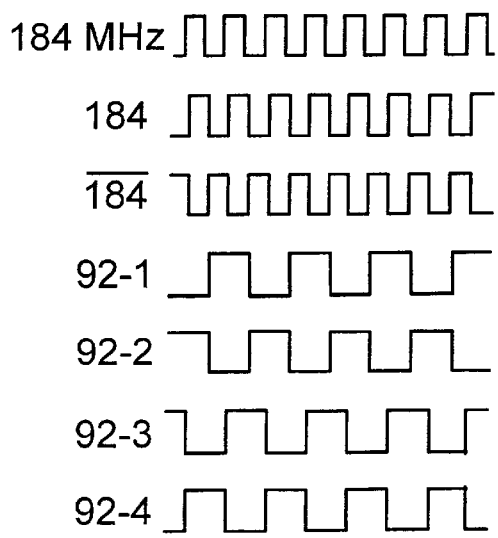

FIG. 3 is a schematic block diagram of the first generator 70 (shown in FIG. 2). In order to better understand the operation of the secondary counters it is advantageous to describe the operation of the generator 70. A practical implementation of the generator 70 comprises four D-flip-flops 73, 74, 75, 76, two XOR-gates 71, 72, two inverters 79, 80 connected as shown in FIG. 3. The two XOR-gates 71 and 72 both receive the first clock signal. The first XOR-gate 71 also receives a zero, thus leaving the first clock signal unchanged. The second XOR-gate 72 receives a "1", thus inverting the first clock signal. The circuit solution with two XOR-gates 71, 72 is preferred, since the delay will be the same for both the non-inverted first clock signal, and the inverted first clock signal. The output signal from the first OR-gate 71 is sent to the clock input CLK of a first D-flip-flop 73 and to the clock input CLK of a second D-flip-flop 74. The first D-flip-flop 73 generates the second clock signal 92-1 on its Q-output. The output signal of the QZ-output of the first D-flip-flop 73 is fed back to the D-input of the first D-flip-flop 73. In addition, the QZ-output signal is inverted by the inverter 79 and sent into the D-input of the second D-flip-flop 74. The second D-flip-flop 74 generates the second clock signal 92-2 on its Q-output. Correspondingly, the output signal from the second OR-gate 72 is sent to the clock input CLK of a third D-flip-flop 75 and to the clock input CLK of a fourth D-flip-flop 76. The third D-flip-flop 75 generates the second clock signal 92-3 on its Q-output. The output signal of the QZ-output of the third D-flip-flop 75 is fed back to the D-input of the third D-flip-flop 75. In addition, the QZ-output signal is inverted by the inverter 80 and sent into the D-input of the fourth D-flip-flop 76. The fourth D-flip-flop 76 generates the second clock signal 92-4 on its Q-output.

The flip-flops of the generator 70 are not scan testable. Therefore, the first frequency can be applied to the generator 70. Hence, in this regard, there is a trade-off between scan testability and the maximum frequency that can be applied to the flip-flops.

The generator 70 described above in connection with FIG. 3 is realized such that, the different D-flip-flops 73–76 will have the same load, assuring reliable operation of the generator 70.

An alternative and simpler solution is to use the QZ-output signal of the first D-flip-flop 73 and the QZ-output signal of the third D-flip-flop 75 to obtain the second clock signals 92-2 and 92-4, respectively. In this alternative embodiment, the second D-flip-flop 74 and the fourth D-flip-flop 76 are omitted. However, this solution requires control of the delays of the second clock signals.

It is important to understand that the circuitry of FIG. 3 only is an example of how to generate the second clock signals 92-1, 92-2, 92-3, 92-4.

FIG. 3 also shows an example of the first clock signal 184 MHz and the second clock signals 92-1, 92-2, 92-3, 92-4 appearing in the generator 70. In particular, the phases of the different second clock signals are illustrated in FIG. 3. The second clock signal 92-2 is an inverted version of 92-1, and the second clock signal 92-4 is an inverted version of 92-3. In addition, there is a phase difference of π/2 between 92-1 and 92-3, a phase difference of π/2 between 92-1 and 92-4, a phase difference of π/2 between 92-2 and 92-3, and a phase difference of π/2 between 92-2 and 92-4. In this particular example, the first clock signal has a first frequency of 184 MHz and the second clock signals have a second frequency equal to half the first frequency, i.e. a second frequency equal to 92 MHz.

With reference to FIG. 2 once more, each secondary counter 50-1, 50-2, 50-3, 50-4 generates a secondary counter signal which has a running counter value that is stepped up by each cycle of the respective one of the second clock signals 92-1, 92-2, 92-3, 92-4. Each one of the secondary counters increments its counter value every time the respective second clock signal goes high. Each secondary counter signal has a secondary counter value of n bits, where n is a positive integer (1, 2, 3, . . . ) In this example, n is equal to 17.

Figure 4:
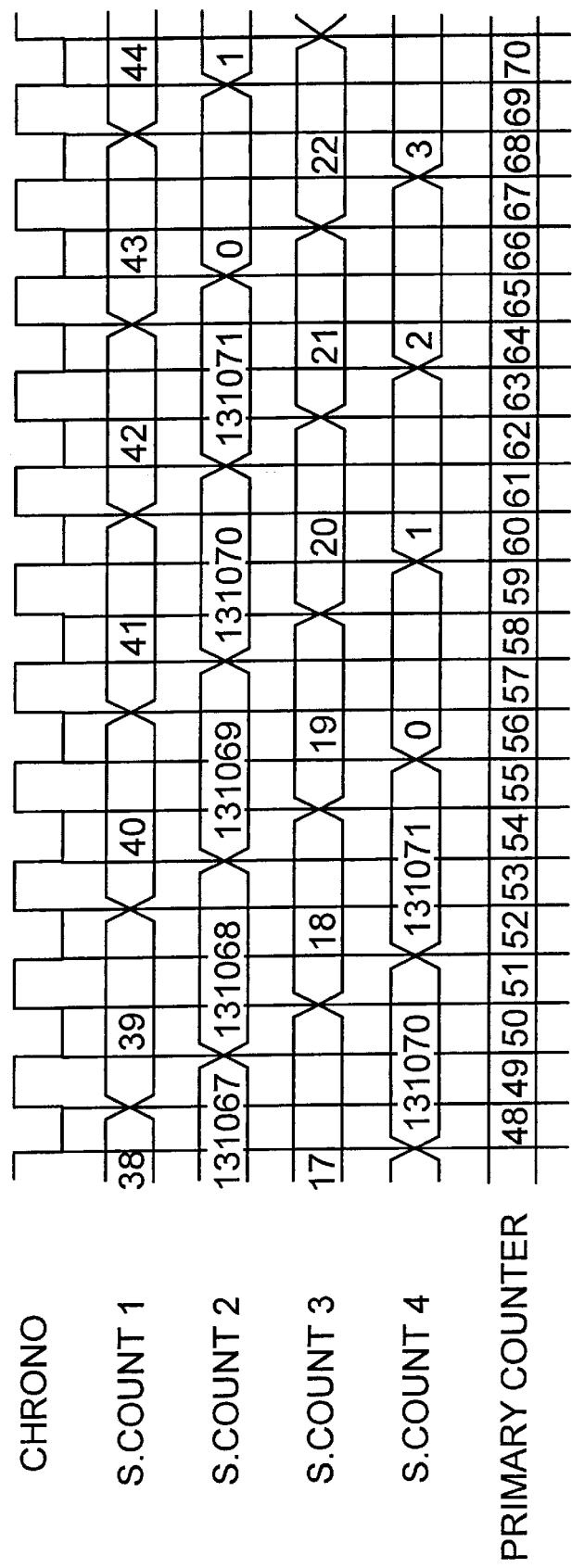
FIG. 4 is a timing diagram showing an example of some of the signals and counter values appearing in the counting circuit of FIG. 2.

In operation, the positive edge carried by 92-1 will step up the counter value of the secondary counter 50-1 at a first time instance. Next, at a second time instance separated 2.7 ns (the cycle time of the second clock signals divided by four) from the first time instance, the positive edge of 92-3 will step up the counter value of the secondary counter 50-3. At a third time instance, occurring 2.7 ns after the second time instance, the positive edge of 92-2 will step up the counter value of the secondary counter 50-2. 2.7 ns later, in relation to the third time instance, the positive edge of 92-4 will step up the counter value of the secondary counter 50-4. 2.7 ns after the stepping up of the secondary counter 50-4, the positive edge carried by 92-1 will once again step up the secondary counter 50-1, and so on. Each one of the secondary counters of the counting circuit 102 according to the invention, will be updated, but not at the same time, with a frequency equal to the second frequency. The second frequency is equal to 92 MHz in this particular example. Adding the four secondary counter values will result in a counter value updated with a frequency of 368 MHz (a resolution of 2.7 ns), because of the phase shift between the second clock signals. Reference is also made to FIG. 4, which is a timing diagram showing the first clock signal, the secondary counter values and the resulting counter value.

In this way a resolution equal to the cycle time (2.7 ns) of twice (2*184=368 MHz) the frequency of the first clock signal that is connected to the counter 102 is assured, even though the first clock frequency itself is too high for direct use in the counter core, in particular when the secondary counters are implemented by scan testable flip-flops.

Of course, other requirements on the circuit design of the counter core may also set a limit to the highest frequency that is possible to use in a given technology.

FIG. 4 is a timing diagram showing an example of some of the signals and counter values appearing in the counting arrangement 102 described above in connection with FIG. 2. There is a periodic square wave first clock signal, CHRONO, which is sent into the counter 102. In this example, four second clock signals are generated in response to CHRONO. Each one of the second clock signals is sent to a respective secondary counter for generating a secondary counter signal or value. The four secondary counter signals S.COUNT 1, S.COUNT 2, S.COUNT 3, S.COUNT 4 are updated, at different time instances, with a frequency equal to the clock frequency divided by two. These four secondary counter signals are added to generate the primary counter signal. The resolution accuracy of the counting circuit will thus be equal to the cycle time of a signal having a frequency twice, the first clock frequency. The counter value, PRIMARY COUNTER, of the primary counter signal is of the same number of bits and the same significance as the counter value of the secondary counter signals. Note, however, that in FIG. 4, all counter values are represented by decimal values. In operation, it is generally assumed that the generation of the primary counter signal is executed continuously over a plurality of clock cycles.

As noted, the interrelationship in phase between the second clock signals is important. In the example of FIG. 3, the second clock signals are phase shifted with respect to each other. It is possible to arrange the second clock signals in such an order that the phase difference between successive second clock signals is π/2. It is important to understand that it does not matter which one of the second clock signals that is sent to which secondary counter. This means that the generator 70 of the second clock signals, and the flip-flops thereof in particular, does not have to be initialized.

Example of first variant of the first embodiment

If the second frequency, i.e. the first clock frequency divided by 2, still is too high for use in the counter core, i.e. the secondary counters, then the first clock signal can be divided into 8 new second clock signals (M=8) phase shifted π/4 and of a new second frequency that is equal to the first clock frequency divided by four. Since the resulting counter value is updated with a frequency equal to M multiplied with the second frequency, the number of secondary counters is also increased to 8, instead of just 4. In this way, the same high resulting resolution accuracy is maintained although the second frequency is reduced. The full frequency potential of the given technology is utilized at the same time as frequency limiting requirements on the circuit design are fulfilled.

By way of example, a first clock signal of 184 MHz can be divided into 8 second clock signals of 46 MHz by further using the signals 92-1, 92-2, 92-3 and 92-4 of FIG. 3. The signal 92-1 is sent to a further D-flip-flop arrangement similar to that of FIG. 3 which comprises the components 73, 74, and 79, for generating two second clock signals. The signal 92-2 is sent to a further D-flip-flop arrangement similar to that of FIG. 3 which comprises the components 75, 76, and 80, for generating two second clock signals. Correspondingly, each one of the signals 92-3, 92-4 is also sent to a further stage so as to generate two second clock signals. Thus, a total of 8 second clock signals is generated. Each one of these 8 second clock signal is sent to a respective secondary counter which produces an individual secondary counter signal. All eight secondary counter signals are then sent to a summing block designed for adding eight binary values or signals.

Examples of other variants of the first embodiment

When, in some applications, it is desired to use only one edge of the first clock signal, then, by way of example, the first clock signal is divided into two second clock signals of a second frequency equal to half of the first clock frequency; such as 92-1 and 92-2. In this example, each one of the two second clock signals (M=2) is sent to a respective secondary counter which generates a secondary counter signal in response to the second clock signal. The two secondary counter signals are added in a summing circuit so as to generate the counter signal of the counting circuit.

Provided that only one edge of the first clock signal is used, it is also possible to divide the first clock signal into three second clock signals (M=3) of a second frequency that is equal to the clock frequency divided by three. The three second clock signals are phase shifted $(2\pi)/3$ with respect to each other. Each one of the second clock signals is sent to a respective secondary counter, and the output signals from the secondary counters are sent to a summing circuit for generating a counter signal, the counter value of which has the same number of bits and the same significance as the counter value of the secondary counters.

Figure 5A:
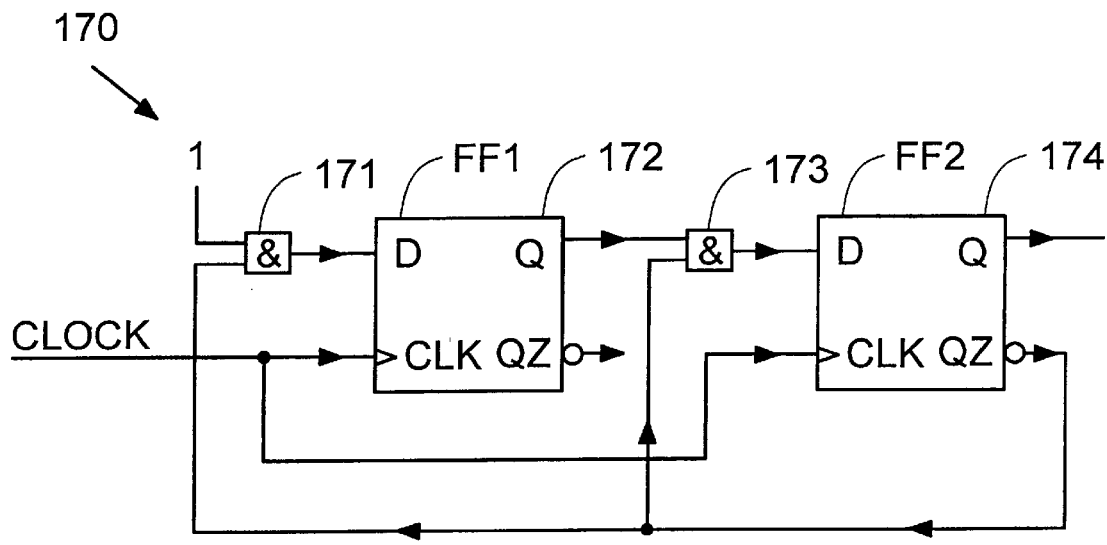
FIG. 5 is a schematic block diagram of a second generator of second clock signals.
Figure 5B:
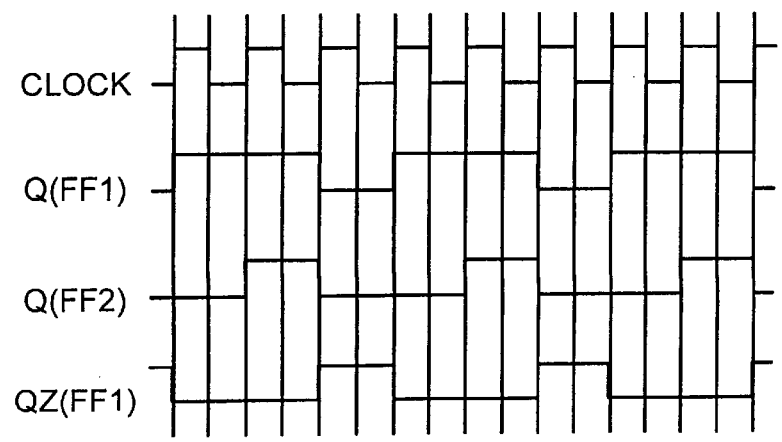

FIG. 5 is a schematic block diagram of a second generator 170 of three second clock signals according to the invention. The generator 170 is responsive to a clock signal CLOCK for generating three second clock signals of a second frequency that is lower than the CLOCK frequency. In this particular example, the CLOCK signal has a frequency of 184 MHz and the second clock signals have a frequency equal to 184/3 MHz.

FIG. 5 also shows an example of the signals appearing in the generator 170.

The generator 170 comprises a first AND-gate 171, a first D-flip-flop 172, a second AND-gate 173 and a second D-flip-flop 174. Each one of the D-flip-flops 172, 174 receives the CLOCK signal at its clock input CLK. The output of the first AND-gate 171 is connected to the D-input of the first D-flip-flop 172. The Q-output of the first D-flip-flop 172 is connected to the first input of the second AND-gate 173. The output of the second AND-gate is connected to the D-input of the second D-flip-flop 174. The QZ-output of the second D-flip-flop 174 is connected to both the second input of the first AND-gate 171 and the second input of the second AND-gate 173. Consider, the Q-output signal Q(FF1) of the first D-flip-flop 172, the Q-output signal Q(FF2) of the second D-flip-flop 174 and the QZ-output signal QZ(FF1) of the first D-flip-flop 172, all of which are illustrated in FIG. 5. By sending a "1" into the first input of the first AND-gate 171, the output signals Q(FF1), Q(FF2) and QZ(FF1) will develop as is shown in FIG. 5. In this way, three second clock signals with different phases will be generated. Since only the positive edges are considered because of the positive edge triggered D-flip-flops in the secondary counters, the positive edges of the three second clock signals occur every third cycle of the CLOCK signal. This corresponds to the CLOCK frequency divided by three. The flip-flops of the generator 170 are not scan testable.

In an alternative embodiment, the secondary counters are implemented by negative edge-triggered flip-flops.

By including a further stage, comprising an AND-gate and a D-flip-flop, between the first D-flip-flop 172 and the second AND-gate 173 in the circuitry of FIG. 5, four second clock signals (M=4) with different phases and of a frequency equal to the clock frequency divided by four, will be generated. The QZ-output signal of the second D-flip-flop 174 of the final stage is distributed to the second input of the AND-gate of the further included stage. If yet a further stage, comprising an AND-gate and a D-flip-flop, is included in sequence between the first stage 171, 172 and the final stage 173, 174, five second clock signals (M=5) phase shifted with respect to each other and of a frequency equal to the clock frequency divided by five will be generated. By including even further stages, further second clock signals will be generated, and the second clock signals will have a frequency equal to the clock frequency divided by (J+1), where J is the number of stages.

In fact, irrespective of whether only one edge or both edges of the first clock signal is used, part of the general idea according to the invention is to generate M second clock signals phase shifted with respect to each other and having a second frequency that is lower than the frequency of the first clock signal. Each one of the second clock signals is sent to a respective one of M secondary counters. M is a positive integer greater than 1, i.e. (2, 3, 4, ...). The second frequency is equal to the frequency of the first clock signal divided by N, where N is a positive integer (1, 2, 3, ...), and adapted to work well in the utilized technology. Furthermore, there is a phase difference equal to $(2\pi)/M$ between at least two of the M second clock signals. In fact, when M is greater than 2 there is generally a phase difference equal to $(2\pi)/M$ between M pairs of the M second clock signals.

The generator of second clock signals can also be implemented in a second technology different from the first technology. By way of example, the generator of second clock signals can be realized in a second technology in which it is possible to divide a first clock signal of 368 MHz into 8 second clock signals phase shifted with respect to each other and of a second frequency equal to 92 MHz. By using 8 secondary counters and a summing circuit generally as described above, a resulting counter value that is updated with a frequency equal to 8*92=736 MHz is generated. The generator of second clock signals can be implemented in a second technology which is able to handle even higher first clock frequencies. Note that the complexity of the generator of second clock signals generally is smaller than that of a binary n-bits counter, in particular when n is greater than 10. The cost of realizing a generator of second clock signals in a high frequency technology is thus smaller than the cost of realizing a binary n-bits counter in the same high frequency technology.

The manner in which the secondary counter signals or values are added is important. At first, problems that may occur if the secondary counter signals are added in a careless manner will be described. Considers by way of example and for reasons of simplicity, the addition of two secondary counter values, each one of 4 bits and associated with a respective second clock signal. Each one of the secondary counters counts from zero to 15. When the maximum count or counter value is reached, the next counter value will be zero and the counter sequence 0, 1, 2, ... 15 starts over again; a situation referred to as a wrap.

a) If no initialization of each individual secondary counter is executed before activation, the following may happen:

Assume that initially the first secondary counter value is equal to 1 0 0 1 (decimal 9), and the second secondary counter value is equal to 1 1 1 1 (decimal 15). To the left, a binary representation is given, and to the right there is a decimal representation:

```
    1 1 1 1       (carry bits)
      1 0 0 1                  9
      1 1 1 1                 15
    ─────────────────────────────
    1 1 0 0 0                 24
```

In the binary representation, the result of the addition is equal to 1 1 0 0 0 (decimal 24); a 5-bits value. Four bits can represent decimal values in the range 0 to 15, and five bits can represent decimal values in the range 0 to 31. Next, when the second secondary counter value is updated in response to its associated second clock signal, the second secondary counter value will be equal to 0 0 0 0 (decimal 0) since a wrap occurs. The first secondary counter value is still 1 0 0 1 since its second clock signal is phase shifted with respect to the second clock signal associated with the second secondary counter value. The resulting counter value, i.e. the result of the addition of 1 0 0 1 and 0 0 0 0 will be equal to 1 0 0 1 (decimal 9). Thus, in this case, the two successive resulting counter values will be 1 1 0 0 0 (decimal 24) and 1 0 0 1 (decimal 9). The resulting counter value will jump from one value to another one in an arbitrary manner. This is undesirable, since an evenly increasing counter sequence, such as 0 0 0 0, 0 0 0 1, 0 0 1 0, 0 0 1 1, 0 1 0 0, . . . (in a binary representation) and 0, 1, 2, 3, 4, . . . (in a decimal representation), is required.

b) Even though each one of the two secondary counter values is initialized and set to zero before activation, problems may occur:

The resulting counter sequence will be 0, 1, 2, . . . , 29, 30, 15 in a decimal representation, and 0 0 0 0, 0 0 0 1, 0 0 1 0, . . . , 1 1 1 0 1, 1 1 1 1 0, 1 1 1 1 in a binary representation. The transition from 1 1 1 1 0 (decimal 30) to 1 1 1 1 (decimal 15) has to be solved by additional logic circuitry.

The most significant bit of the result of the addition between 1 0 0 1 and 1 1 1 1, i.e. the most significant bit of the 5-bits value 1 1 0 0 0 (decimal 24), is the final or last carry bit of the addition. If the 4 least significant bits of the result of the addition of 1 0 0 1 and 1 1 1 1, are considered, a 4-bits value, 1 0 0 0 (8 in a decimal representation) will be obtained. Consequently, the two successive resulting counter values will be 1 0 0 0, i.e. a decimal 8, and 1 0 0 1, i.e. a decimal 9. Although this is an example of only two successive resulting counter values, the principle or idea of considering the 4 least significant bits of the result of the addition is generally applicable.

The summing and implementations thereof

According to the invention, in order to generate an evenly increasing number sequence without the need for initialization and additional logic circuitry, the secondary counter signals are preferably added such that the resulting counter value has the same number of bits and the same significance as the counter value of the secondary counter signals.

By way of example, the resulting counter sequence goes from zero to the maximum count, $2^n-1$, where n is a positive integer, and then starts over again from zero. Thus, the counter sequence is generated continuously on a cyclical basis.

Preferably, the summing circuit 51, which adds the secondary counter signals, is implemented by using the known programming language VERILOG and the known synthesizing program SYNOPSIS. The synthesizing program SYNOPSIS transforms a program written in VERILOG language to gate network hardware, which executes the addition. Generally, the addition is executed in a parallel implementation. In a parallel implementation, the signals are added simultaneously.

If the summing circuit 51 receives M secondary counter signals of n bits each, then the gate network implementation comprises a gate network and an associated D-flip-flop for each one of the n bits. Making up a total of n gate networks and n D-flip-flops. No gate networks and associated D-flip-flops are provided for the final carry bits of the addition so that the result of the addition will have the same number of bits, i.e. n bits, and the same significance as the secondary counter signals.

In a parallel implementation, in which no gate networks and associated D-flip-flops are provided for the final carry bits of the addition, an addition of three 4-bits values will look like this:

```
    1 1 1       (carry bits)
    1 1 0 1              13
    1 0 1 1              11
    1 1 1 1              15
    ─────────────────────────
    0 1 1 1               7
```

Alternatively, the adding is executed in sequence. Conventional circuits, such as 74-XX-83 which is a 4-bits adder, can be used. Several 4-bits units are connected to each other in a known manner so as to realize a n-bits adder. Several n-bits adders are used for realizing the summing block 51 if several secondary counter values are to be added. A first n-bits adder adds two binary values and outputs a result of n bits, but also a carry bit on its carry output. If more than two secondary counter values are to be added, then this carry bit is connected to the carry input of the next n-bits adder, otherwise the carry output is unconnected. In general, the carry output is always unconnected in the last adder stage, so that only the n-bits output signal of the last adder stage is considered. In this way, the final carry bit is discarded or forgotten.

In yet another embodiment of the invention, the summing block 51 generates the counter signal of the counter 102 by adding the secondary counter signals, taking all carry bits into account. Subsequently, the x least significant bits of the result of the addition are considered, where x is equal to the number of bits of the counter value of a secondary counter signal. Consider the following example. Three 4-bits values are added in parallel (or in series) with consideration taken to all carry bits:

```
    1 0 1 1     (carry bits)
      1 1 0 1             13
      1 0 1 1             11
      1 1 1 1             15
    ─────────────────────────
    1 0 0 1 1 1           39
```

In the binary representation, the result is a 6-bits value. A software implementation is provided for considering the four least significant bits. Thus, the result will be 0 1 1 1; a value which has the same number of bits as the values that are added.

In another alternative embodiment, all the carry bits are taken into account in the adding, and then an AND-operation is executed between the result of the addition and a first binary value with the following properties:

a) the first binary value has the same number, z, of bits as the result of the addition;

b) each one of the x least significant bits is equal to "1", a binary one, where x is equal to the number of bits of an individual secondary counter value; and c) each one of the (z–x) most significant bits is equal to "0", a binary zero.

By way of example, assume that 3-bits secondary counter values have been added and that the result of the addition is a 4-bits value. Thus, z=4, x=3, z–x=1, and the first binary value will be 0 1 1 1.

By adding the secondary counter signals such that the counter value of the resulting counter signal will have the same number of bits and the same significance as the counter value of a secondary counter signal, the start value in the different secondary counters does not matter. There is no need to have the same start value in the secondary counters. Thus, no reset or initialization of the secondary counters is required, which is a clear advantage.

It is possible to use secondary counters, each of which generates a secondary counter signal which has a running counter value that is stepped down by each cycle of the respective one of the second clock signals. In this case, a decreasing resulting counter sequence will be provided by the summing circuit.

It is to be understood that the general idea according to the invention can be used in any general application in which the frequency of a clock signal is too high for direct use in the currently available or utilized technology, taking quality requirements on the circuit design into account. This kind of application can be found in all areas of technology, and more particularly in fields where high frequency signals are encountered. This is also true for the inventive method described below in connection with FIG. 6.

Figure 6:
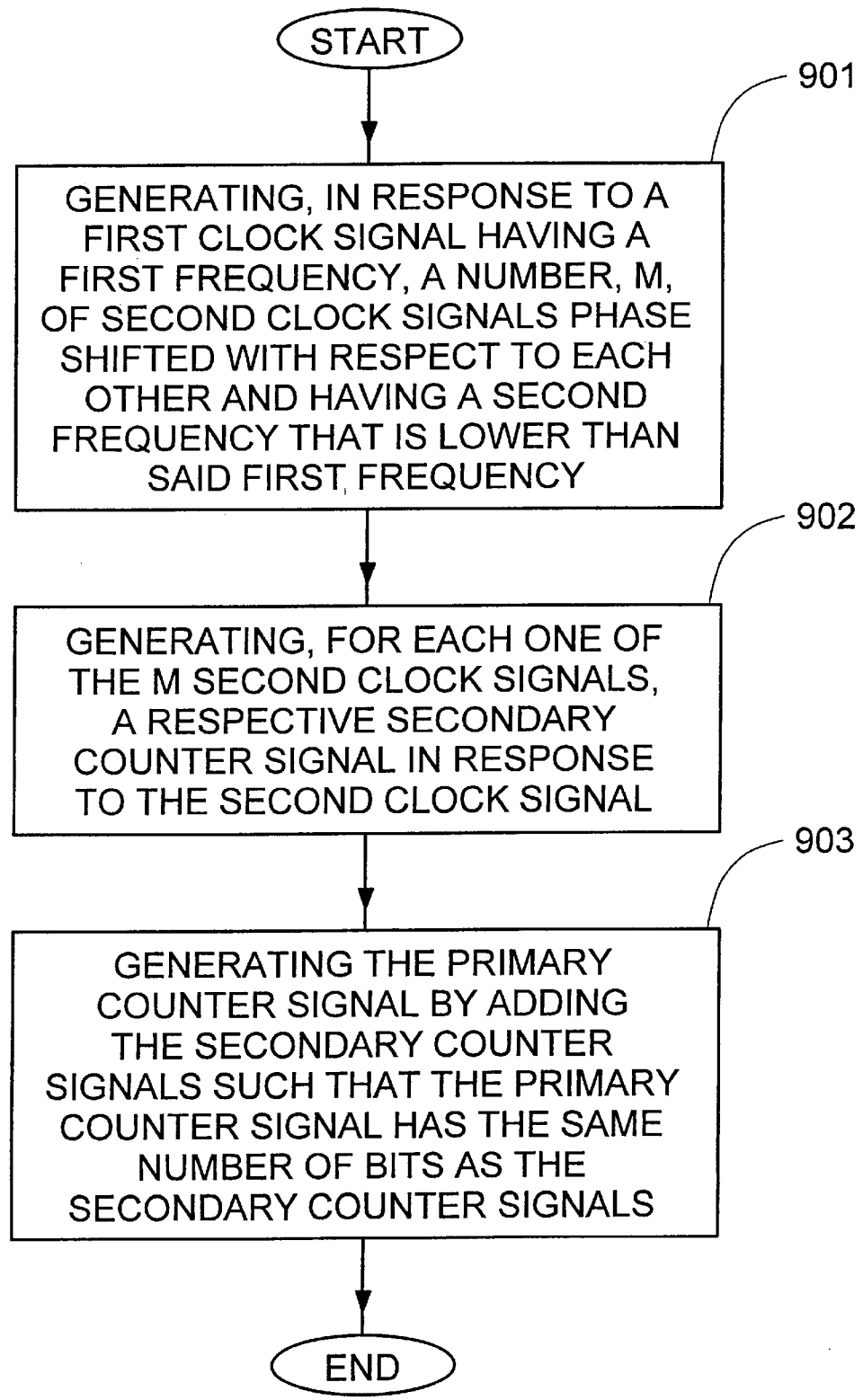
FIG. 6 is a schematic flow diagram of a method for generating a counter signal according to the invention.

FIG. 6 is a schematic flow diagram of a method for generating a counter signal according to the invention. In step 901, a predetermined number, M, of second clock signals are continuously generated in response to a first clock signal of a first frequency. The second clock signals are phase shifted with respect to each other and have a second frequency that is lower than the first frequency. In step 902, for each second clock signal, there is generated a respective secondary counter signal in response to the second clock signal. In step 903, the counter signal, the primary counter signal, is generated by adding the secondary counter signals or values such that the counter value of the primary counter signal will have the same number of bits and the same significance as the counter value of the secondary counter signals. Generally, the above steps are continuously repeated so as to continuously generate the primary counter signal. To a certain degree, the steps 901–903 are executed in parallel.

Example of a particular application

A particular application of the counting circuit according to the invention will be described with reference to FIG. 7. In FIG. 7 there is illustrated a telecommunication system. It basically comprises switches S or equivalents, physical links interconnecting the switches, and various auxiliary devices. In general, the physical links are grouped into trunk groups TG which extend between the switches S. Normally a telecommunication system would be implemented with more switches and trunk groups than is illustrated in FIG. 7. However, the simplified representations of FIG. 7 will be used for describing the particular application of the present invention. There are access points to the physical network, to which access points, access units such as telephone sets and computer modems, are connected. A physical link utilizes transmission equipment, such as fiber optic conductors, coaxial cables or radio links. A switch S generally comprises a number of circuits which normally are mounted on circuit boards that are stored in cabinets.

A switch normally includes a clock generating system which provides digital circuits in the switch with clock signals. To meet the requirements on safety and reliability, the clock generating system should be redundant. Redundancy is ensured by using multiple clock signal generating units. In general, a redundant clock system with multiple units requires some type of regulation system. The clock system can be of the type master-slave or a mutually regulating clock system. In either case, the clock signals of different clock generating units have to be synchronized with each other in some way. To this end, phase differences between the clock signals of the different clock signal generating units are measured. These measurements are realized by a phase detector. The phase detector comprises the counting circuit according to the present invention, a predetermined number of registers and a subtractor unit. The counting circuit provides the registers with a counter signal, also referred to as a count signal. Each one of the registers receives a respective one of the clock signals of the redundant clock system for storing the current counter value of the counter signal as a first counter value in response to timing information carried by the respective clock signal. Examples of timing information is a synchronization pattern and simply the positive or negative edge of a square wave clock signal. The first counter values are pairwise subtracted with each other by the subtractor unit to generate phase difference representing values or signals. The resolution accuracy of the phase difference measurements depends on the counting circuit.

The above particular application of the present invention should not be interpreted as limiting. A multitude of other applications exists in the field of telecommunications, but also in other areas of technology.

Second embodiment of the invention

In a technical application such as the one described in connection with FIG. 7 it is sometimes desirable to make the actual adding or summing less time critical. FIG. 8 is a schematic block diagram of a less time critical counter or counting circuit according to an embodiment of the invention. The block diagram of FIG. 8 is similar to that of FIG. 2 except for the secondary registers 99-1, 99-2, 99-3, 99-4. The secondary counters 50-1 to 50-4 generate secondary counter signals in the same manner as described in connection with FIG. 2. However, in this embodiment of the invention, each secondary counter signal is sent to a respective one of the secondary registers. In the particular technical application in which the counting circuit is utilized, when the output signal of the counting circuit is required in, for instance, a calculation, an external load signal is sent to the load input of each one of the secondary registers. Thus, for each secondary counter signal upon receipt of the load signal, a count value is updated by storing the current value of the secondary counter signal in the respective secondary register. These count values are sent to the summing circuit 51 which generates a resulting counter signal, the value of which has the same number of bits and the same significance as the value of the secondary counter signals. In this way, the actual summing has to be executed when the output counter signal has to be used for some reason. The summing itself is less time critical, since the frequency with which the summing has to be executed may be reduced considerably. By way of example, a summing frequency equal to twice the frequency of the first clock signal may be reduced to a summing frequency equal to the sample frequency, such as 8 kHz, of a technical system.

Each one of the secondary registers is of the same number of bits as the secondary counter signals.

The embodiments described above are merely given as examples, and it should be understood that the present invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. A counting device comprising:

generator means for generating, in response to a first clock signal of a first frequency, second clock signals phase shifted with respect to each other;

secondary counters, each one responsive to a respective one of said second clock signals for counting clock pulses thereof, thus providing a respective secondary counter signal; and a summing circuit for adding said secondary counter signals, wherein said generator means further comprises means for generating said second clock signals with a second frequency that is lower than said first frequency; and said summing circuit adds said secondary counter signals such that the counter value of the resulting summed counter signal has the same number of bits and the same significance as the counter value of said secondary counter signals, thus providing an increasing or decreasing counter sequence.

2. A counting device according to claim 1, wherein said means for generating said second clock signals with a second frequency comprises frequency dividing means for generating said second frequency such that it is equal to said first frequency divided by N, where N is a positive integer.

3. A counting device according claim 1, wherein said generator means generates M second clock signals, where M is a positive integer greater than 2, and in that there is a phase difference of $(2\pi)/M$ between M pairs of said M second clock signals.

4. A counting device according to claim 1, wherein said counter sequence is evenly increasing/decreasing and continuously provided on a cyclical basis.

5. A counting method comprising the steps of:

generating, in response to a first clock signal of a first frequency, second clock signals phase shifted with respect to each other;

counting, for each second clock signal, the clock pulses thereof to provide a respective secondary counter signal; and adding said secondary counter signals, wherein said step of generating second clock signals comprises the step of generating said second clock signals with a second frequency that is lower than said first frequency; and said step of adding said secondary counter signals is executed such that the counter value of the resulting summed counter signal has the same number of bits and the same significance as the counter value of said secondary counter signals, thus providing an evenly increasing/decreasing counter sequence.

6. A counting method according to claim 5, wherein said step of generating said second clock signals with a second frequency comprises the step of dividing said first frequency by N, where N is a positive integer, so as to obtain said second frequency.

7. A counting method according to claim 5, wherein M second clock signals are generated, where M is greater than 2, and in that there is a phase difference of $(2\pi)/M$ between M pairs of said M second clock signals.

8. A counting method according to claim 5, wherein said counter sequence is continuously provided on a cyclical basis.

9. A counting circuit comprising:

generator means for generating, in response to a first clock signal of a first frequency, second clock signals phase shifted with respect to each other;

secondary counters, each one responsive to a respective one of said second clock signals for generating a respective secondary counter signal; and a summing circuit for adding said secondary counter signals, wherein said generator means further comprises means for generating said second clock signals with a second frequency that is lower than said first frequency; and said counting circuit further comprises means for discarding at least one final carry bit of said adding to generate a resulting counter signal such that the counter value of said resulting counter signal has the same number of bits and the same significance as the counter value of said secondary counter signals, thus providing a strictly increasing/decreasing counter sequence.

10. In a telecommunication system, a counting device comprising:

generator means for generating, in response to a first clock signal of a first frequency, second clock signals phase shifted with respect to each other;

secondary counters, each one responsive to a respective one of said second clock signals for counting of clock pulses thereof, thus providing a respective secondary counter signal; and a summing circuit for adding said secondary counter signals, wherein said generator means further comprises means for generating said second clock signals with a second frequency that is lower than said first frequency; and said counting device further comprises means for considering the x least significant bits of the result of said adding, where x is equal to the number of bits of the counter value of said secondary counter signals so as to generate a primary counter signal with an increasing/decreasing counter sequence.

11. In a telecommunication system, a counting method comprising the steps of:

generating, in response to a first clock signal of a first frequency, second clock signals phase shifted with respect to each other;

counting, for each second clock signal, the clock pulses thereof to provide a respective secondary counter signal; and adding said secondary counter signals, wherein said step of generating second clock signals comprises the step of generating said second clock signals with a second frequency that is lower than said first frequency; and said counting method further comprises the step of considering the x least significant bits of the result of said adding, where x is equal to the number of bits of the counter value of said secondary counter signals, thus providing an increasing/decreasing counter sequence.

12. A counting device comprising:

generator means for generating, in response to a first clock signal of a first frequency, second clock signals phase shifted with respect to each other;

secondary counters, each one responsive to a respective one of said second clock signals for counting clock pulses thereof, thus providing a respective secondary counter signal; and a summing circuit, characterized in that said counting device further comprises registers, each one responsive to a respective one of said secondary counter signals and an external load signal for updating a first count value by storing the current count value of said secondary counter signal upon receipt of said load signal, said generator means further comprises means for generating said second clock signals with a second frequency that is lower than said first frequency; and said summing circuit is responsive to said first count values for adding the first count values such that the counter value of the resulting summed counter signal has the same number of bits and the same significance as the first count values, thus providing an increasing/decreasing counter sequence.

* * * * *